US007250675B2

United States Patent
Fasano et al.

(10) Patent No.: US 7,250,675 B2
(45) Date of Patent: Jul. 31, 2007

(54) METHOD AND APPARATUS FOR FORMING STACKED DIE AND SUBSTRATE STRUCTURES FOR INCREASED PACKING DENSITY

(75) Inventors: Benjamin V. Fasano, New Windsor, NY (US); Brian R. Sundlof, Verbank, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 10/908,277

(22) Filed: May 5, 2005

(65) Prior Publication Data

US 2006/0249827 A1 Nov. 9, 2006

(51) Int. Cl.
*H01L 23/34* (2006.01)
(52) U.S. Cl. ...................... 257/723; 257/712
(58) Field of Classification Search ................ 257/686, 257/723, 712
See application file for complete search history.

(56) References Cited

U.S. PATENT DOCUMENTS

| | | | |
|---|---|---|---|
| 6,172,874 B1 | 1/2001 | Bartilson | |
| 6,373,133 B1 * | 4/2002 | DiGiacomo et al. | 257/713 |
| 6,392,298 B1 * | 5/2002 | Leighton et al. | 257/728 |
| 6,611,057 B2 | 8/2003 | Mikubo et al. | |
| 6,627,980 B2 | 9/2003 | Eldridge | |
| 6,724,079 B2 * | 4/2004 | Viswanathan et al. | 257/704 |
| 6,858,926 B2 | 2/2005 | Moden et al. | |
| 2002/0074637 A1 | 6/2002 | McFarland | |
| 2003/0020173 A1 | 1/2003 | Huff et al. | |
| 2004/0016939 A1 | 1/2004 | Akiba et al. | |
| 2004/0041256 A1 | 3/2004 | Takehara et al. | |

OTHER PUBLICATIONS

Silicon, [online]; [retrieved on Feb. 14, 2005]; retrieved from the Internet http://www.intel.com/research/silicon/mobilepackaging.htm.

* cited by examiner

*Primary Examiner*—Roy Potter
(74) *Attorney, Agent, or Firm*—Cantor Colburn LLP; Joseph Petrokaitis

(57) ABSTRACT

A stacked semiconductor apparatus has at least one die attached to a first side of a carrier substrate. A first circuitized substrate is attached to the first side of the carrier substrate and overlying the at least one die in a manner such that the first circuitized substrate serves as an electrical interconnection device and a heat spreading lid. The first circuitized substrate is further configured so as to facilitate cooling of the at least one die by at least a cross flow of a cooling medium therethrough.

9 Claims, 4 Drawing Sheets

METHOD AND APPARATUS FOR FORMING STACKED DIE AND SUBSTRATE STRUCTURES FOR INCREASED PACKING DENSITY

BACKGROUND

The present invention relates generally to integrated circuit devices and packaging methods, and, more particularly, to a method and apparatus forming stacked die and substrate structures for increased packing density.

As microelectronic packaging becomes physically more compact, the amount of "real estate" available on circuit boards and other component-supporting substrates becomes ever smaller. Various die packaging schemes have thus evolved in order to promote greater component density. For example, integrated circuits packaged in plastic or ceramic packages may include extended metal leads for soldering onto a printed circuit board or for insertion into a socket. In many cases, a single package will contain a single integrated circuit, although multiple chips are more commonly being manufactured within a single package. The use of such multiple chips in individual packages results in a low circuit density as a single integrated circuit ceramic or plastic package consumes relatively large areas of real estate on the circuit boards, particularly where a socket is used.

Multi-chip Module (MCM) packaging technology has also been developed to suit applications where it is necessary to reduce the size of the assembly or where speed or electrical noise considerations require shorter connecting leads. A typical multi chip module package combines a number of individual or unpackaged integrated circuits and directly attaches them to a mounting surface (e.g., ceramic substrate, printed circuit board or other substrate). Integrated circuits within MCM assemblies may be electrically connected using various bonding techniques such as soldering, wire bonding, and flip-chip technologies. Many MCM assemblies are generally constructed in a dense two-dimensional array to minimize the surface area otherwise occupied by many individually packaged devices mounted on circuit boards.

It has, however, been recognized that it may be desirable in certain applications to enhance circuit density by vertically stacking dies and substrates in two or more layers. In one approach to vertical stacking, for example, a stack of semiconductor dice may be formed by attaching flip chip mounted die to flexible printed circuit films that are in turn attached to frames. The films are stacked and thereafter encapsulated by a liquid encapsulant that flows around the stack of dice. However, in such a configuration, there is no effective means for cooling any of the die, thus limiting the amount of power the die in such an assembly can dissipate. Certain other organic packages are typically implemented with folded layer designs, which suffer from poor thermal spreading abilities and poor mechanical handling behavior as flexible films.

On the other hand, other vertically stacked modules can provide both high speed processing and cooling capability by attaching micro-miniature heat sink devices (having internal groves for passing coolant therethrough) to the high-power chips such as CPUs. The lower power chips, such as memory chips for example, are simply stacked on top of one another through solder bump connections. Although this type of configuration provides vertical integration and cooling capacity for some of the chips, the packaging density is still limited in that the undersides of the overlying and underlying substrates are not array interconnected.

Accordingly, it would be desirable to provide a stacked die and substrate apparatus having increased packing density and performance, as well as improved cooling capability for both high power die and low power die such as embedded memory or memory included on application specific integrated circuits (ASICs).

SUMMARY

The foregoing discussed drawbacks and deficiencies of the prior art are overcome or alleviated by a stacked semiconductor apparatus having at least one die attached to a first side of a carrier substrate. A first circuitized substrate is attached to the first side of the carrier substrate and overlying the at least one die in a manner such that the first circuitized substrate serves as an electrical interconnection device and a heat spreading lid. The first circuitized substrate is further configured so as to facilitate cooling of the at least one die by at least a cross flow of a cooling medium therethrough.

In another embodiment, a method for forming a stacked semiconductor apparatus includes attaching at least one die to a first side of a carrier substrate, and attaching a first circuitized substrate to the first side of the carrier substrate so as to overlie the at least one die in a manner such that the first circuitized substrate serves as an electrical interconnection device and a heat spreading lid. The first circuitized substrate is further configured so as to facilitate cooling of the at least one die by at least the introduction of a cross flow of a cooling medium therethrough.

BRIEF DESCRIPTION OF THE DRAWINGS

Referring to the exemplary drawings wherein like elements are numbered alike in the several Figures.

DETAILED DESCRIPTION

Disclosed herein is a method and apparatus forming stacked die and substrate structures for increased packing density that also provides thermal management such that the stacking scheme can be applied to higher power modules. In one embodiment, a shaped, circuitized multilayer ceramic substrate functions as both a ceramic wiring device and a lid/heat spreader. The shape thereof allows for the sequential or parallel processing and assembly of stacked substrates with die, while also providing a robust interconnect between each layer. As the substrates are metallized, they further provide good thermal conductivity (e.g., >20 w-mK) so as to allow heat dissipation from the die when thermal interface materials (TIMs) are used (e.g., pastes, epoxies and solders)

or provide a path for coolant flow from an external cooling delivery such as a fan, flowing liquid, sprayed liquid or embedded heat pipes.

Figure 1A:
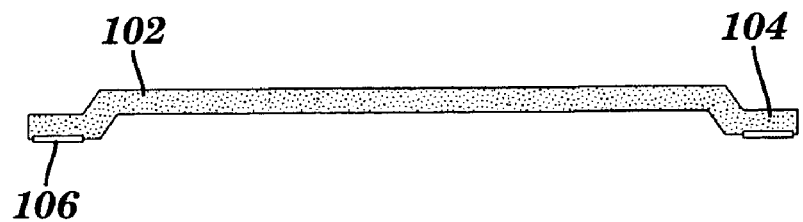
FIGS. 1(a) through 1(e) illustrate a series of cross sectional views depicting an exemplary stacked chip carrier fabrication sequence, in accordance with an embodiment of the invention.

Referring initially to FIGS. 1(a) through 1(e), there is shown a series of cross sectional views depicting an exemplary stacked chip carrier fabrication sequence, in accordance with an embodiment of the invention. In FIG. 1(a), a circuitized single chip or multichip module substrate 102 is formed in a manner such that it is capable of receiving one or more integrated circuit dice attached thereto, as well as provide shielding and thermal management capability for one or more IC dice located therebeneath. In the embodiment depicted, the perimeter 104 of the circuitized, heat spreading lid/substrate 102 is reshaped so as to create a slight step height for the center of the substrate. This may be implemented, for example, by applying a reshaping mold to a sintered substrate so as to deform the perimeter 104 of the substrate 102. Likewise, a ceramic substrate in which a cavity has been formed by processes well known by those skilled in the art can also provide the desired shape suitable for placement of the die under the lid. By using such a structure, clearance is created between the bottom of the substrate and another similarly shaped substrate or a carrier substrate (shown hereinafter). The bottom side of the perimeter 104 also includes I/O pads 106 for ball grid array (BGA) attachment (for example) to a lower circuitized lid substrate or carrier substrate.

Figure 1B:
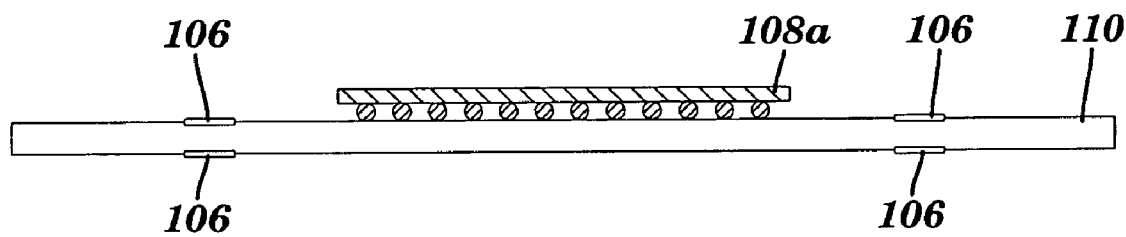
Figure 1C:
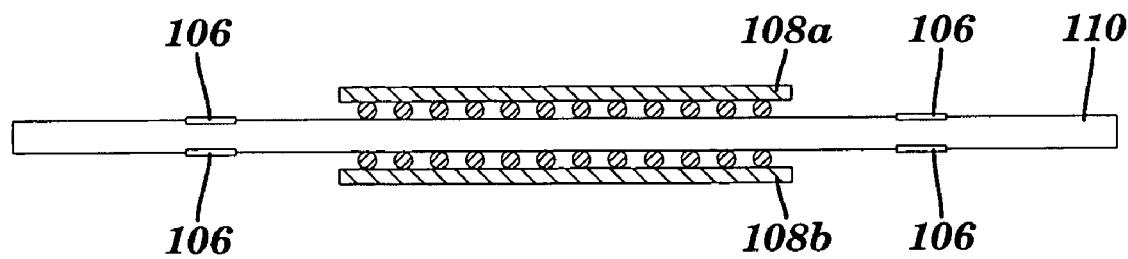

In FIG. 1(b), a first integrated circuit die 108a is shown attached to a chip carrier substrate 110. Where gap control is of particular concern, the die 108 may be thinned in accordance with known die-thinning techniques. As is also shown in FIG. 1(b), the carrier substrate 110 is also provided with I/O pads 106 on both sides thereof. In addition to creating a stacked die/substrate arrangement in the positive z-direction with respect to the carrier substrate 110, the stack may also be configured in the negative z-direction as well. Thus, FIG. 1(c) illustrates the attachment of a second integrated circuit die 108b to the opposite side of the carrier substrate 110.

Figure 1D:
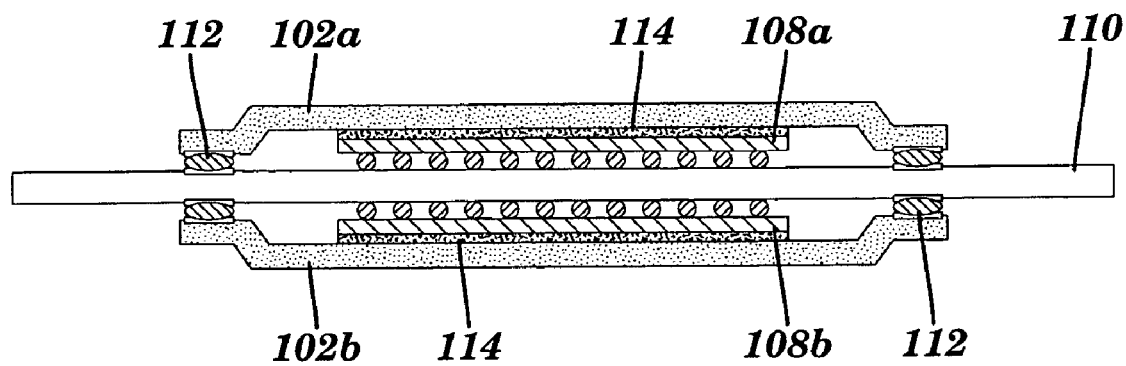

The stacking ability realized through the use of the circuitized lid/substrate 102 configuration is shown in FIG. 1(d). In particular, a first substrate lid 102a is shown attached to the top side of the carrier substrate 110 through solder ball connections 112, thus providing a housing for die 108a. In addition, a thermal paste material 114 is applied between the top of die 108a and substrate lid 102a to provide a thermal transfer medium therebetween. Correspondingly, a second substrate lid 102b is shown attached to the bottom side of the carrier substrate 110 through solder ball connections 112, thus providing a housing for die 108b. Similarly, a thermal paste material 114 is applied between the top of die 108b (attached upside down) and substrate lid 102b to provide a thermal transfer medium therebetween.

As illustrated in greater detail hereinafter, the width of a substrate/lid 102 may correspond to the width (the dimension into the page) of the carrier substrate 110, or may alternatively be narrower so as to sufficiently cover the surface area occupied by the die attachments. This will allow for additional area for heat transfer using a flowing coolant technique described later.

Figure 1E:
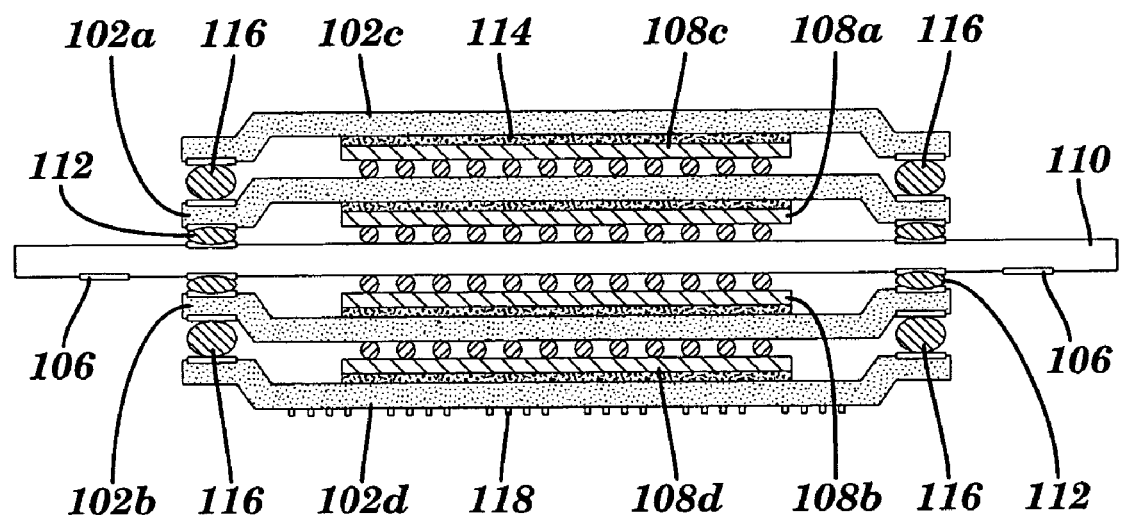

Referring now to FIG. 1(e), the resulting stack height is increased in both the positive and negative z-direction through the addition of another level of die and lid attachment. More specifically, a third die 108c is attached atop the first circuitized substrate/lid 102a, with a third circuitized substrate/lid 102c attached to the first circuitized substrate/lid 102a through solder ball connections 116. The solder ball connection 116 may, in one embodiment, be formed at a larger diameter than solder balls 112 and/or be formed at a higher attaching temperature. It should also be noted at this point that the perimeter of the substrate/lids 102 need not be shaped in the exemplary embodiment depicted, but could alternatively be left flat. In this case, the height of the solder ball connections 112, 116 can be increased to provide sufficient clearance for the die attachments. Similarly attached die can be thinned to further reduce the overall height of the attached die and associated perimeter ball heights. From an assembly and testing standpoint, a die/circuitized substrate (lid) sub unit could be preassembled and tested in parallel, and thereafter joined to the stack as a single component rather than being manufactured by a die/lid/die/lid series type assembly approach.

As shown on the lower portion of the stack of FIG. 1(e), a fourth die 108d is attached atop the second circuitized substrate/lid 102b, with a fourth circuitized substrate/lid 102d attached to the second circuitized substrate/lid 102b through solder ball connections 116. Again, a thermal paste 114 is used between each successive chip and overlying lid attachment. It will be appreciated that the height of the stack can be increased as desired in either the positive or negative z-directions by adding even further die and lid attachments or by adjusting the interconnect conductor height(s). Thus, both BGA ball diameters and CGA column lengths can be used to control the die-to-lid spacings. Optionally, a heat sink/radiator (not shown in FIG. 1(e)) could be attached to the topmost lid 102c for additional thermal management, while the bottommost lid 102d may include I/O connections 118 for attachment to a module. Furthermore, the carrier substrate 110 may also include I/O pads 106 for column attachment to a printed circuit board or edge connector card in addition to the BGA I/O connections 118.

Figure 2A:
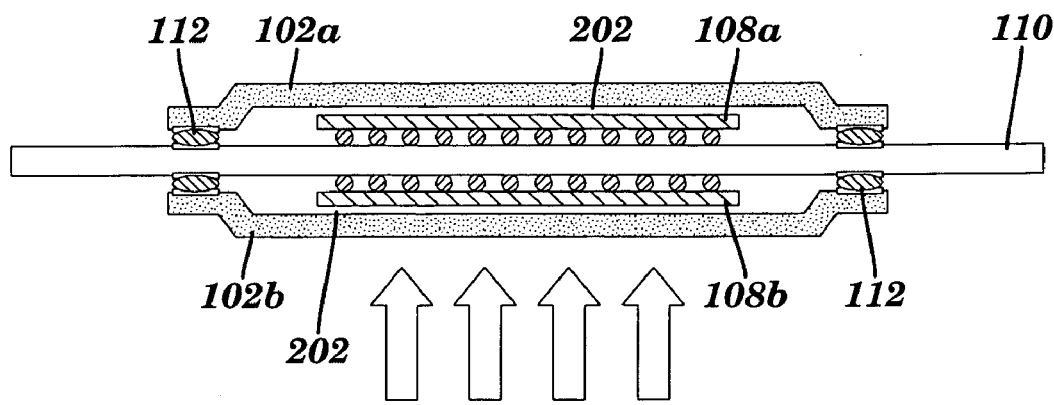
FIGS. 2(a) through 2(c) depict an alternative embodiment of the stacking structure of FIGS. 1(a) through 1(e)
Figure 2B:
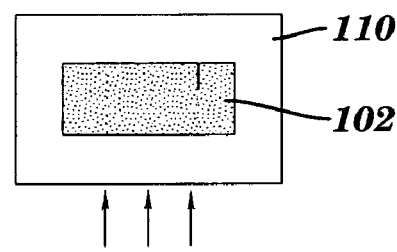
Figure 2C:
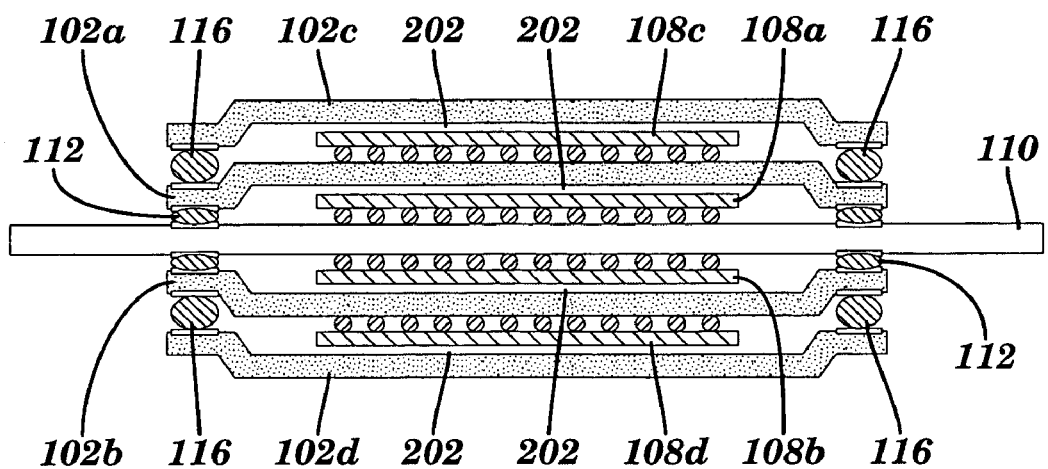

Referring now to FIGS. 2(a) through 2(c), an alternative embodiment of the stacking structure of FIGS. 1(a) through 1(e) is illustrated. In this embodiment, a thermal paste is not applied between the top of a die and the overlying circuitized lid. Rather, an air gap 202 is left between each die and the overlying lid so as to facilitate the cross flow of air or other cooling medium (represented by the arrows in FIG. 2(a)) through the open sides of the structure (in this case through the page). FIG. 2(b) is a top view that illustrates the width of the topmost circuitized substrate/lid 102 with respect to the carrier substrate 110. In this embodiment, the reduced width of the substrate/lid 102 is conducive to the side-to-side coolant flow across the stack. FIG. 2(c) is similar to FIG. 1(e) with respect to the formation of additional die/lid attachments in the positive and negative z-direction, but again provides an air gap 202 in lieu of thermal paste. As is the case with FIG. 1(e), the solder ball connections 116 may be formed at a larger diameter than solder balls 112 and/or be formed at a higher attaching temperature. Moreover, the solder ball connections 112, 116 may be appropriately sized and/or the die may be thinned to reduce or eliminate the need for shaping the perimeter of the circuitized substrate/lid components. Likewise, CGA length adjustments can also be used to control the standoff height of the layers. Although not shown, additional wiring and device attachments may be made on the outer surfaces of lids 102c and 102d. It should further be recognized that a flowing fluid or gas cooling system allows lower thermally conductive circuitized lids to be used since less dependence for heat transfer using the lid as a thermally conductive path occurs.

Figure 3A:
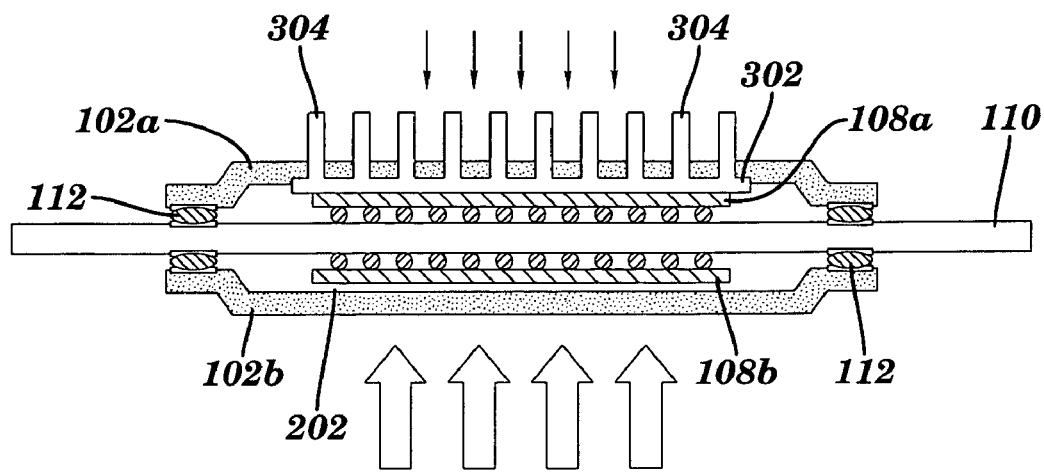
FIGS. 3(a) and 3(b) depict still another embodiment of a vertical substrate/die stacking structure, in which an outrigger heat spreader device is utilized.
Figure 3B:
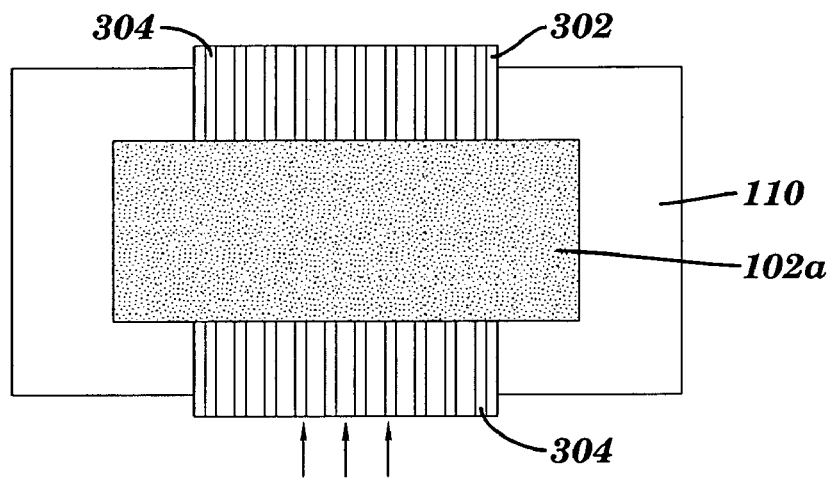

Referring now to FIGS. 3(a) and 3(b), there is shown still another embodiment of a vertical substrate/die stacking structure, in which a heat spreader device 302 is interposed between a die 108a and the circuitized substrate/lid 102a attached above. The heat spreader 302 may be attached to the die 108a by a suitable epoxy or paste, and includes a plurality of upwardly extending fins 304 that provide an additional cooling capability for removing heat from the die 108a. The airflow in contact with the fins 304 may be normal or parallel thereto. In the cross sectional view of FIG. 3(*a*), the fins 304 do not actually protrude through the surface of the substrate/lid 102a. Rather, the width of the spreader 302 extends beyond the width of both the die 108a and the circuitized substrate/lid 102a, such that the fins 304 are positioned in an "outrigger" type configuration. This is perhaps illustrated in better detail in the top view of FIG. 3(*b*). Through the additional cooling capability provided by a device such as an outrigger type heat spreader 302, the topmost die in a vertical stack can be selected to be a higher power chip, such as a CPU for example. Devices may be mounted on the outer surfaces of lid 102a.

Figure 4:
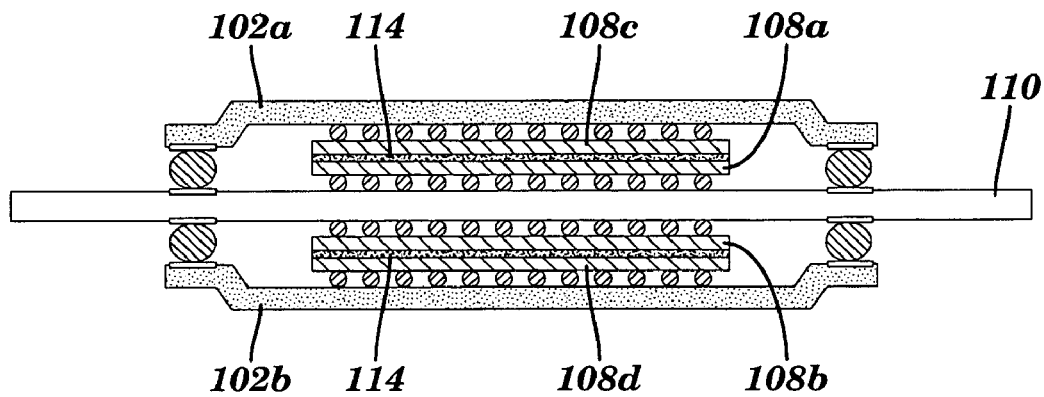
FIG. 4 illustrates a further embodiment of a vertical stacking configuration, in which dice are internally stacked between the carrier substrate and one or more circuitized lids.

Finally, FIG. 4 illustrates a further embodiment of a vertical stacking configuration, in which dice are internally stacked between the carrier substrate and one or more circuitized lids. In particular, the carrier substrate 110 has a first die 108a attached on a top side thereof, and a second die 108b on a bottom side thereof, similar to earlier embodiments. In addition, however, the first die 108a also has a third die 108c stacked thereon in a back-to-back arrangement and separated by a TIM 114 (e.g., paste or thermal grease) or a combination of TIM and a heat spreader. Correspondingly, the second die 108b also has a fourth die 108d stacked thereon in a back-to-back arrangement and separated by a thermal heat spreader material 114. In turn, the third die 108c is attached to the bottom surface of circuitized substrate/lid 102a, while the fourth die is attached to the bottom surface of circuitized substrate/lid 102b. With this arrangement, particular attention may need to be paid to the manner in which the substrate/lid components are attached to the carrier substrate. For example, without consideration of distortion control, a substrate/lid applied with excessive compression could possibly distort the shape of the solder connections of the die, and possibly even short adjacent solder balls to one another. Thus, tight gap management and particular attention to heat spreader/epoxy selection may be warranted for the stacked internal die configuration.

As will thus be appreciated, the embodiments described herein provide an efficient, stacked ceramic packing module for providing improved density of devices. The open structure further allows for flow-through cooling of the dice within a stacked module. Although the exemplary embodiments presented herein depict single die stacking, it will be understood that additional die can also be attached upon a given circuitized substrate/lid and/or the carrier substrate. Likewise, stacks of stacked modules can also be created. Also, the advantages of testing subassemblies before assembly should be apparent.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A stacked semiconductor apparatus, comprising:
   at least one die attached to a first side of a carrier substrate;
   a first circuitized substrate attached to said first side of said carrier substrate and overlying said at least one die attached to said first side of said carrier substrate in a manner such that said first circuitized substrate serves as an electrical interconnection device and a heat spreading lid;
   said first circuitized substrate further formed such that a perimeter thereof is shaped so as to create a step height at a center portion of said first circuitized substrate, wherein both the perimeter and the center portion of said first circuitized substrate are substantially parallel to said carrier substrate; and
   said first circuitized substrate further configured so as to facilitate cooling of said at least one die attached to said first side of said carrier substrate by at least a cross flow of a cooling medium therethrough.

2. The apparatus of claim 1, wherein the perimeter of said first circuitized substrate is shaped such that a step height is created at a center portion thereof.

3. A stacked semiconductor apparatus, comprising:
   at least one die attached to a first side of a carrier substrate;
   a first circuitized substrate attached to said first side of said carrier substrate and overlying said at least one die aft ached to said first side of said carrier substrate in a manner such that said first circuitized substrate serves as an electrical interconnection device and a heat spreading lid;
   said first circuitized substrate further configured so as to facilitate cooling of said at least one die aft ached to said first side of said carrier substrate by at least a cross flow of a cooling medium therethrough; and
   a thermal heat spreading material disposed between the top surface of said at least one die attached to said first side of said carrier substrate and the bottom surface of said first circuitized substrate.

4. A stacked semiconductor apparatus, comprising:
   at least one die attached to a first side of a carrier substrate;
   a first circuitized substrate attached to said first side of said carrier substrate and overlying said at least one die attached to said first side of said carrier substrate in a manner such that said first circuitized substrate serves as an electrical interconnection device and a heat spreading lid;
   said first circuitized substrate further configured so as to facilitate cooling of said at least one die attached to said first side of said carrier substrate by at least a cross flow of a cooling medium therethrough; and
   a heat spreading device attached to the top of said at least one die attached to said first side of said carrier substrate, said heat spreading device extending beyond the width of said first circuitized substrate and having upwardly disposed fins on the outer edges thereof.

5. A stacked semiconductor apparatus, comprising:
   at least one die attached to a first side of a carrier substrate;
   a first circuitized substrate attached to said first side of said carrier substrate and overlying said at least one die attached to said first side of said carrier substrate in a manner such that said first circuitized substrate serves as an electrical interconnection device and a heat spreading lid;

said first circuitized substrate further configured so as to facilitate cooling of said at least one die attached to said first side of said carrier substrate by at least a cross flow of a cooling medium therethrough;

at least one die attached to a second side of said carrier substrate such that the top surface of said at least one die attached to said second side of said carrier substrate is oriented in a downward direction with respect to said at least one die attached to said first side of said carrier substrate; and a second circuitized substrate attached to said second side of said carrier substrate and overlying said at least one die attached to said second side of said carrier substrate, in said downward direction in a manner such that said second circuitized substrate serves as a electrical interconnection device and a heat spreading lid.

6. The apparatus of claim 1, wherein said first circuitized substrate is further configured to receive one or more additional die and circuitized substrate assemblies attached thereupon in a stacked configuration.

7. A stacked semiconductor apparatus, comprising:

at least one die attached to a first side of a carrier substrate;

a first circuitized substrate attached to said first side of said carrier substrate and overlying said at least one die attached to said first side of said carrier substrate in a maimer such that said first circuitized substrate serves as an electrical interconnection device and a heat spreading lid;

said first circuitized substrate further configured so as to facilitate cooling of said at least one die attached to said first side of said carrier substrate by at least a cross flow of a cooling medium therethrough;

at least one die attached to the bottom of said first circuitized substrate; and a thermal heat spreading material between the top of said at least one die attached to the bottom of said first circuitized substrate and the top of said at least one die attached to said first side of said carrier substrate so as to define a die stack between said first side of said carrier substrate and said first circuitized substrate.

8. The apparatus of claim 1, wherein said first circuitized substrate has a width less than that of said carrier substrate.

9. A stacked semiconductor apparatus, comprising:

at least one die attached to a first side of a carrier substrate;

a first circuitized substrate attached to said first side of said carrier substrate and overlying said at least one die attached to said first side of said carrier substrate in a manner such that said first circuitized substrate serves as an electrical interconnection device and a heat spreading lid; and said first circuitized substrate further configured so as to facilitate cooling of said at least one die attached to said first side of said carrier substrate by at least a cross flow of a cooling medium therethrough;

wherein said first circuitized substrate is attached to said carrier substrate through an electrically conductive grid array attachment.

* * * * *